(12) United States Patent
Kamenov et al.

(10) Patent No.: US 9,733,395 B2
(45) Date of Patent: Aug. 15, 2017

(54) MICROLITHOGRAPHIC PROJECTION EXPOSURE APPARATUS

(75) Inventors: Vladimir Kamenov, Essingen (DE); Daniel Kraehmer, Essingen (DE); Toralf Gruner, Aalen-Hofen (DE); Karl-Stefan Weissenrieder, Elchingen (DE); Heiko Feldmann, Aalen (DE); Achim Zirkel, Munich (DE); Alexandra Pazidis, Aalen (DE); Bruno Thome, Aalen (DE); Stephan Six, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1399 days.

(21) Appl. No.: 13/112,357

(22) Filed: May 20, 2011

(65) Prior Publication Data

US 2011/0222043 A1   Sep. 15, 2011

Related U.S. Application Data

(63) Continuation of application No. 12/031,595, filed on Feb. 14, 2008, now abandoned, which is a (Continued)

(30) Foreign Application Priority Data

Sep. 3, 2005   (DE) .................. 10 2005 041 938

(51) Int. Cl.
*G03B 27/68* (2006.01)
*G02B 1/11* (2015.01)
*G03F 7/20* (2006.01)

(52) U.S. Cl.
CPC .......... *G02B 1/11* (2013.01); *G03F 7/70191* (2013.01); *G03F 7/70308* (2013.01); *G03F 7/70958* (2013.01)

(58) Field of Classification Search
CPC ........... G03F 7/70191; G03F 7/70308; G03F 7/70958; G02B 1/11
(Continued)

(56) References Cited

U.S. PATENT DOCUMENTS 5,963,365 A    10/1999  Shirai
6,243,203 B1 *  6/2001  Schleipen .............. G02B 1/115
                                                 359/359

(Continued)

FOREIGN PATENT DOCUMENTS

EP    0 952 491 A2    10/1999
EP    0 994 368 A      4/2000
(Continued)

OTHER PUBLICATIONS

Machine translation of JP 2004-302113.*
(Continued)

*Primary Examiner* — Deoram Persaud
(74) *Attorney, Agent, or Firm* — Fish & Richardson P.C.

(57) ABSTRACT

The disclosure relates to a microlithographic projection exposure apparatus, such as are used for the production of large-scale integrated electrical circuits and other microstructured components. The disclosure relates in particular to coatings of optical elements in order to increase or reduce the reflectivity.

29 Claims, 7 Drawing Sheets

Related U.S. Application Data continuation of application No. PCT/EP2006/008605, filed on Sep. 4, 2006.

(58) Field of Classification Search
 USPC .................................. 355/53, 67; 359/613
 See application file for complete search history.

(56) References Cited

U.S. PATENT DOCUMENTS

| | | |
|---|---|---|
| 6,285,443 B1 | 9/2001 | Wangler et al. |
| 6,404,499 B1 | 6/2002 | Stoeldraijer et al. |
| 6,574,039 B1 | 6/2003 | Murata et al. |
| 6,628,456 B2 | 9/2003 | Takaki et al. |
| 2003/0090638 A1 | 5/2003 | Koehler et al. |
| 2004/0169836 A1* | 9/2004 | Wegmann ................ 355/67 |
| 2005/0018312 A1 | 1/2005 | Gruner et al. |
| 2005/0254120 A1 | 11/2005 | Zaczek et al. |
| 2007/0128453 A1 | 6/2007 | Pazidis et al. |
| 2008/0094599 A1 | 4/2008 | Scheible et al. |
| 2008/0297754 A1 | 12/2008 | Kamenov et al. |
| 2014/0320955 A1 | 10/2014 | Kamenov et al. |

FOREIGN PATENT DOCUMENTS

| | | |
|---|---|---|
| EP | 1 152 263 | 11/2001 |
| JP | 2002-189101 A | 7/2002 |
| JP | 2004-302113 A | 10/2004 |
| WO | WO 2005/069078 A | 7/2005 |
| WO | WO 2005/119369 | 12/2005 |

OTHER PUBLICATIONS

H. Bauer et al., "Optical Coating for UV Photolithography Systems," SPIE vol. 2776, pp. 353-365.
The International Search Report and a Written Opinion from the counterpart PCT Application No. PCT/EP2006/008605, dated Mar. 22, 2007.
Machine translation of JP2004-302113.

* cited by examiner

MICROLITHOGRAPHIC PROJECTION EXPOSURE APPARATUS

CROSS-REFERENCE TO RELATED APPLICATIONS

This application is a continuation of, and claims priority to U.S. application Ser. No. 12/031,595, filed Feb. 14, 2008, which claims priority under 35 U.S.C. §120 to, International Application PCT/EP2006/008605, filed Sep. 4, 2006, which claims benefit of German patent application serial number 10 2005 041 938.0, filed Sep. 3, 2005. The contents of these applications are hereby incorporated by reference in its entirety.

FIELD

The disclosure relates to a microlithographic projection exposure apparatus, such as are used for the production of large-scale integrated electrical circuits and other microstructured components. The disclosure relates in particular to coatings of optical elements in order to increase or reduce the reflectivity.

BACKGROUND

Integrated electrical circuits and other microstructured components are conventionally produced by applying a plurality of structured layers onto a suitable substrate which, for example, may be a silicon wafer. In order to structure the layers, they are first covered with a photoresist which is sensitive to light of a particular wavelength range, for example light in the deep ultraviolet (DUV) spectral range. The wafer coated in this way is subsequently exposed in a projection exposure apparatus. A mask, which contains a pattern of structures, is thus illuminated by an illumination system and imaged onto the photoresist with the aid of a projection objective. Since the imaging scale is generally less than one, such projection objectives are often also referred to as reducing objectives.

After the photoresist has been developed, the wafer is subjected to an etching process so that the layer becomes structured according to the pattern on the mask. The photoresist still remaining is then removed from the other parts of the layer. This process is repeated until all the layers have been applied on the wafer.

The mirrors used in projection exposure apparatus generally include a reflection coating, which is made up of a plurality of individual layers and whose reflection coefficient is often more than 90%. Lenses and other refractive optical elements, on the other hand, are provided with antireflection coatings in order to reduce light losses and imaging errors due to undesired double reflections at the interfaces of the refractive optical elements.

SUMMARY

In some embodiments, the disclosure provides a projection exposure apparatus, having optical elements whose (anti-) reflection coatings on the one hand are economical and on the other hand do not significantly compromise the imaging properties of the projection objective.

In certain embodiments, the disclosure provides a microlithographic projection exposure apparatus having an optical element, on which there is an antireflection coating in order to reduce the reflectivity. This is configured so that the transmission coefficients of the antireflection coating for mutually orthogonal polarization states differ from one another by no more than 10% (e.g., by no more than 3%, by no more than 1%) over an incidence angle in the range of from 0° to 70°. The projection exposure apparatus furthermore includes a device for homogenizing an intensity distribution, which can be arranged in or in the vicinity of a field or pupil plane.

The same applies for reflection coefficients of reflection coatings.

The device for homogenizing the intensity distribution can ensure that sizeable angle dependencies of the transmission coefficient or the reflection coefficient, such as may occur in the polarization optical optimisation, do not have an intolerable effect on the imaging properties. Homogenizing the intensity distribution in this context is intended to mean that undesired variations of the intensity distribution in the image plane are suppressed. The desired intensity distribution in the image plane is an equidistribution such that, in the absence of a mask, all points will be exposed to the same intensity.

Optionally, the coatings could be configured so that the small difference in the transmission or reflection coefficient for orthogonal polarization states is achieved not by a single coating, but by the overall effect of a plurality or even all of the coatings which are contained in the projection exposure apparatus. The individual optimisation is in this way replaced by an overall optimisation. Here again, the device for homogenizing the intensity distribution can ensure that sizeable angle dependencies of the transmission coefficient or the reflection coefficient do not have an intolerable effect on the imaging properties.

The device for homogenizing the intensity distribution may be a grey filter, such as is known in the prior art. It is particularly favorable for one or more grey filters to be specially tuned to the coating (or all the coatings as a whole). The grey filter, which may for example be designed as a simple transmission filter, may for example be designed so that only variations of the intensity distribution due to the coating are compensated for. Variations of the intensity distribution which are attributable to different causes may, for example, be reduced by other, filters (e.g., adjustable filters) or one or more different devices.

Sizeable phase errors, which are due to the coatings, may be corrected by a phase error correction device, for example manipulators which are known per se or local non-axisymmetric surface deformations.

The disclosure furthermore relates to antireflection coatings having particularly advantageous polarization optical properties. Thus, antireflection coatings are provided in which both the reflection coefficients and the phase depend only slightly on the polarization state. Other antireflection coatings have the property that the reflection coefficient is greater for p-polarized light than for s-polarized light over a particular incidence angle range, or that p-polarized light passes through the antireflection coating with a retardation relative to the s-polarized light within a particular incidence angle range. This makes it possible to combine a plurality of reflection or antireflection coatings so that polarization-neutral behavior is obtained overall. In some embodiments, the coatings are distinguished in that they include only layers with a packing density of more than 85%, and are therefore very durable.

BRIEF DESCRIPTION OF THE DRAWINGS

Other features and advantages will be found in the following description of an exemplary embodiment with reference to the drawings, in which.

DETAILED DESCRIPTION

Figure 1:
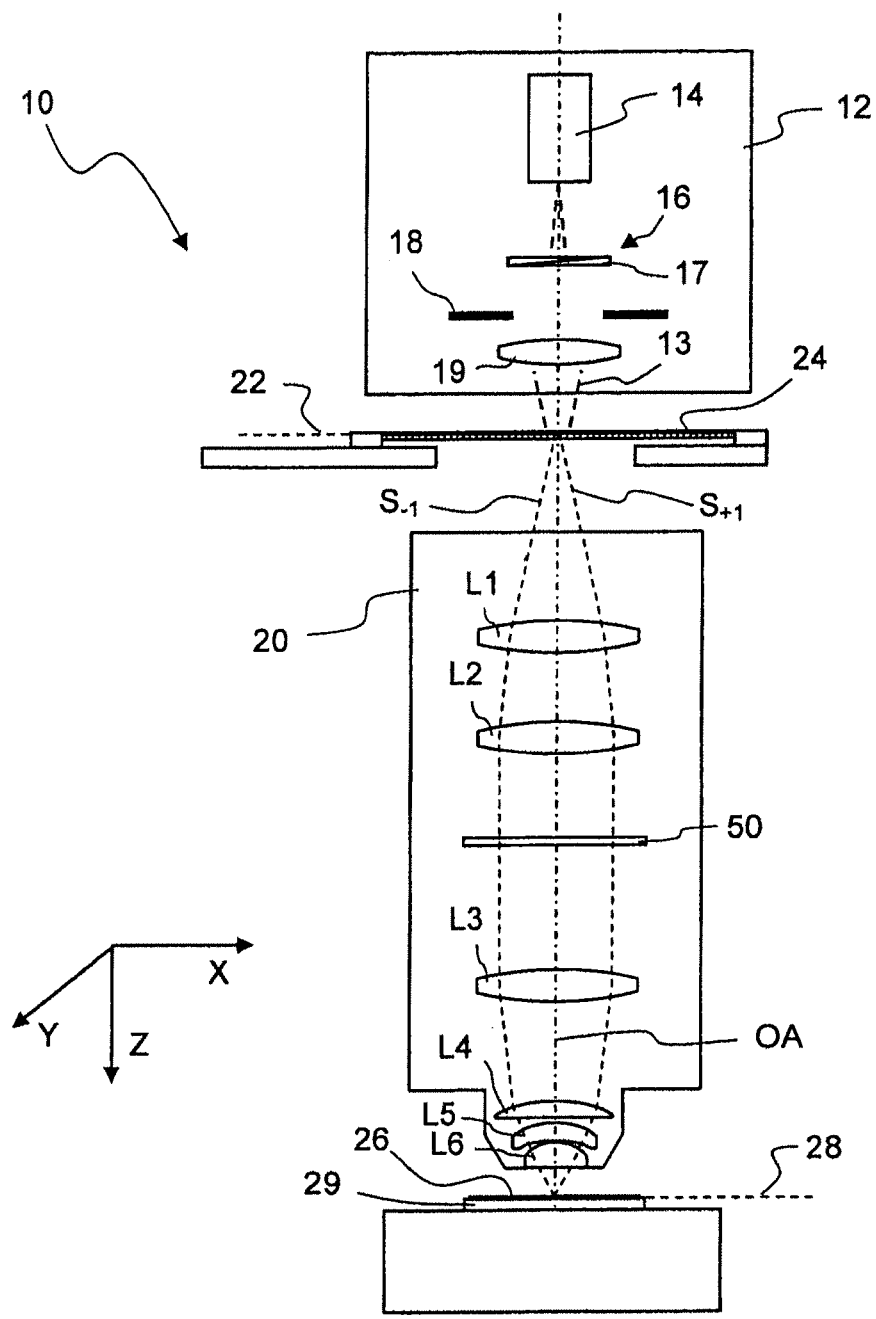
FIG. 1 shows a meridian section through a projection exposure apparatus.

FIG. 1 shows a meridian section through a microlithographic projection exposure apparatus, denoted overall by 10, in a highly schematised representation which is not to scale. The projection exposure apparatus 10 includes an illumination system 12 with a light source 14 for generating a projection light beam 13. The light source 14, which may for example be an excimer laser, generates short-wave projection light. In the present exemplary embodiment, the wavelength of the projection light is 193 nm. It is likewise possible to use other wavelengths, for example 157 nm or 248 nm.

The illumination system 12 furthermore contains illumination optics, indicated by 16, with a depolarizer 17 and a field aperture 18. The illumination optics 16 reshape the projection light beam generated by the light source 14 in the desired way, and make it possible to set up different illumination angle distributions. To this end, the illumination optics 16 may for example contain exchangeable diffractive optical elements and/or microlens arrays. Since such illumination optics 16 are known in the prior art, see for example U.S. Pat. No. 6,285,443 A, the explanation of further details in this regard may be omitted.

An objective 19 of the illumination system 12 images the field aperture 18 sharply onto a subsequent object plane of a projection objective 20.

The projection objective 20 contains a multiplicity of lenses and other optical elements, only a few of which (denoted by L1 to L6) are indicated by way of example in FIG. 1 for the sake of clarity. The projection objective 20 may also contain other optical elements, for example imaging mirrors or mirrors used for folding the beam path, or filter elements. In the case of extremely short wavelengths, for example 13 nm, the projection objective 20 contains only mirrors as imaging elements, since sufficiently transparent lens materials are not available for these short wavelengths. The same applies for the illumination system 12.

The projection objective 20 is used to project a reduced image of a mask 24, which can be arranged in an object plane 22 of the projection objective 20 and is illuminated by the projection light beam 13, onto a photosensitive layer 26 which, for example, may be a photoresist. The layer 26 is located in an image plane 28 of the projection objective 20 and is applied onto a support 29, for example a silicon wafer.

The lenses contained in the illumination system 12 and in the projection objective 20 are provided with an antireflection coating. The purpose of the antireflection coating is to reduce the proportion of light which is reflected at the interfaces of the lenses and is therefore lost for the projection, or leads to double reflections. The coatings generally contain a multiplicity of a thin individual layers, the refractive indices and thicknesses of which are selected so that the desired properties are achieved for the wavelength of the projection light 13.

In the case of antireflection coatings, these properties are primarily a very high transmissivity of more than 98%. Such a high transmissivity should be achieved for a large incidence angle range. Especially in the case of very high-aperture projection objectives 20, incidence angles of up to 70° may occur, and even more in particular cases. If the transmissivity depends too strongly on the incidence angle, then this will lead to field-dependent structure width variations with coatings close to the pupil, and to angle-dependent structure width variations with near-field coatings.

It is moreover expected of the antireflection coatings applied on lenses that they have these optical properties irrespective of the polarization state of the incident projection light 13. If the transmissivity varies too greatly for orthogonal polarization states in an antireflection coating, then this polarization dependency may lead to undesired imaging errors. This is related to the fact that, despite the use of a depolarizer 17 in the illumination system 12, the projection light 13 does not remain fully depolarized when it passes through the projection objective 20. Reasons for this may, for example, be intrinsically or stress-birefringent lens materials, polarizing mask structures as well as the polarization dependencies being discussed here in the case of antireflection and reflection coatings.

If an antireflection coating is arranged in the vicinity of a field plane, then the polarization dependency of its transmissivity leads to intensities varying over the image field when the projection light has a preferential polarization direction that varies over the field. Such intensity variations in a field plane become manifested as undesired field-dependent structure width variations on the component. On the other hand, if an antireflection coating with a polarization-dependent transmissivity is arranged close to the pupil, then an already existing angle dependency of the polarization state may likewise lead to undesired structure width variations.

For this reason, when developing an antireflection coating, attempts are made to keep the difference $\Delta T$ between the transmission coefficients for orthogonal polarization states less than 10%, such as less than 3%.

(Anti-) reflection coatings of lenses and mirrors may furthermore cause the phase of the light passing through the coatings to vary as a function of the polarization state. This makes the coating optically birefringent, which has an unfavorable effect on the imaging quality in the image plane. For this reason, the permissible phase difference $\Delta\phi$ between orthogonal polarization states should be less than $\frac{1}{10}$ of the wavelength $\lambda$ of the projection light 13.

A high average transmissivity on the one hand, as well as a low polarization dependency of the transmissivity and of the phase on the other hand, cannot however be achieved over a sizeable incidence angle range, or can be achieved at most with extremely great outlay.

According to the disclosure, the coatings in the projection exposure apparatus 10 therefore configured so that the polarization dependency of the transmission coefficient and of the phase are kept low over a large incidence angle range. The average transmissivity and the average phases may however vary perceptibly over the incidence angle range. The concomitant perturbations of the imaging are corrected in a comparatively straightforward way, for example with the aid of grey filters or—in the case of phase errors—local non-axisymmetric surface deformations.

Substantial polarization independency, specifically in the case of antireflection coatings, means that the transmission coefficients for mutually orthogonal polarization states differ from one another by no more than 10% (e.g., by no more than 3%, by no more than 1%) over an incidence angle range of 70°. The same applies for the reflection coefficients in the case of reflection coatings.

Layer systems configured in such a way can be developed and produced with relatively little outlay. The way to do this in detail may be found in standard textbooks, for example T. W. Baumeister "Optical Coating Technology".

Figure 2:
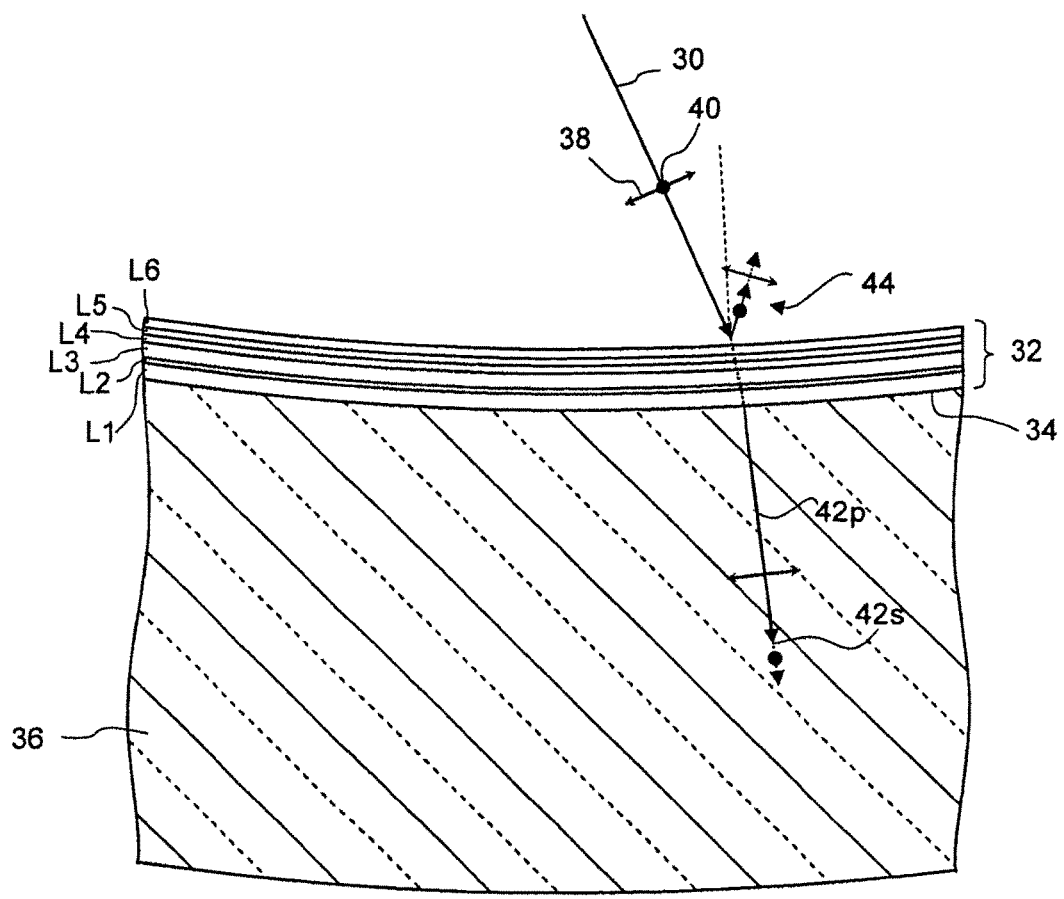
FIG. 2 shows a sectional representation (not to scale) of a lens with an antireflection coating according to an exemplary embodiment of the disclosure.

FIG. 2 shows a lateral section of a detail of an exemplary embodiment of an antireflection coating 32, in which the transmission coefficients for mutually orthogonal polarization states differ from one another by no more than 1%. The antireflection coating 32 consists of 6 thin individual layers L1 to L6, the materials and optical thicknesses of which are specified in Table 1. The antireflection coating 32 is applied on a concave surface 34 of a lens 36, which consists for example of quartz glass, and it is configured for a wavelength of $\lambda=193$ nm. The quantity QWOT (quarter wave optical thickness) refers to the optical thickness, i.e. the product of refractive index and the geometrical thickness, in units of a quarter wavelength.

TABLE 1

Layer Specification Exemplary Embodiment 1

| Layer | 1 | 2 | 3 | 4 | 5 | 6 |
|---|---|---|---|---|---|---|
| Material | $LaF_3$ | $MgF_2$ | $LaF_3$ | $MgF_2$ | $LaF_3$ | $MgF_2$ |
| QWOT | 1.37 | 0.44 | 1.41 | 0.75 | 0.60 | 0.87 |

Likewise suitable in principle, albeit less preferred owing to the low durability, is the coating described as Exemplary Embodiment 4 in JP 2004-302113 A, which is constructed from three layers. EP 0 994 368 A2 describes a more durable coating which has five layers but in which the transmission coefficients for orthogonal polarization states differ from one another by about 5% in the incidence angle range of from 0° to 70°.

It will be assumed below that the light ray 30 contains both a p-polarized component 38 indicated by double arrows and an s-polarized component indicated by black circles 40. The majority of the light striking the antireflection coating 32 will be transmitted, with the transmission coefficients $T_s$ and $T_p$ respectively for the s-polarized component 40 and for the p-polarized component 38 differing slightly. In FIG. 2, this slight difference is indicated by the arrow 42s for the transmitted s-polarized component 40 being somewhat longer than the arrow 42p for the transmitted p-polarized component 38.

In general, the reflectivity of the antireflection coating 32 also differs according to the polarization state of the incident light, which is indicated in an exaggeratedly represented way at 44 in FIG. 2.

The average transmissivity $\langle T \rangle$ of the antireflection coating 32 is given by the following Equation (1):

$$\langle T \rangle = (|T_s| + |T_p|)/2. \tag{1}$$

The polarization dependency of the transmissivity is best described by the difference between the transmission coefficients $T_s$ and $T_p$ according to Equation (2)

$$\Delta T = |T_s| - |T_p|. \tag{2}$$

For the average phase $\langle \phi \rangle$ and the phase difference $\Delta \phi$, Equations (3) and (4) respectively apply:

$$\langle \phi \rangle = (arg(T_s) + arg(T_p))/2 \tag{3}$$

$$\Delta \phi = arg(T_s) - arg(T_p). \tag{4}$$

Figure 3:
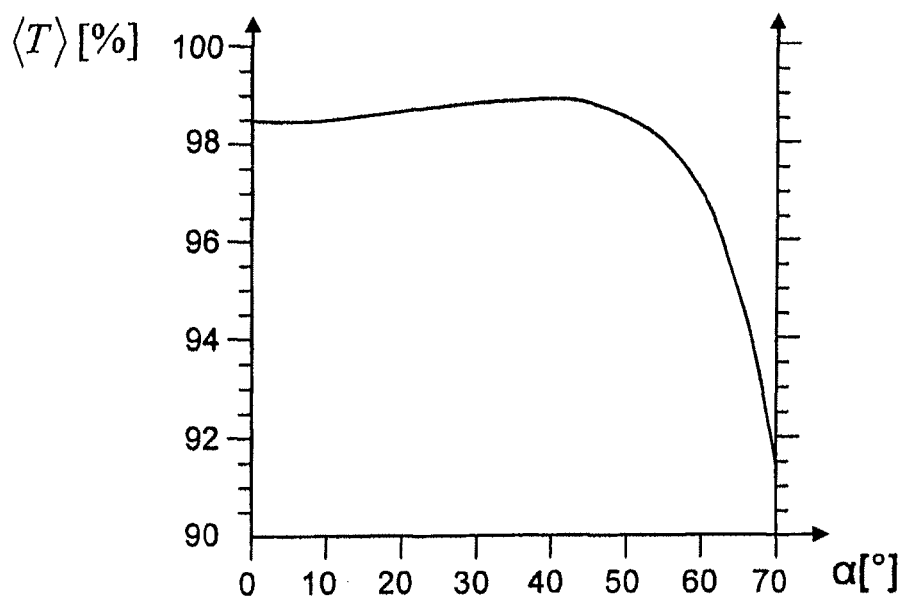
FIG. 3 shows a graph, in which the average transmissivity is plotted as a function of the incidence angle for the exemplary embodiment of an antireflection coating as shown in FIG. 2.
Figure 4:
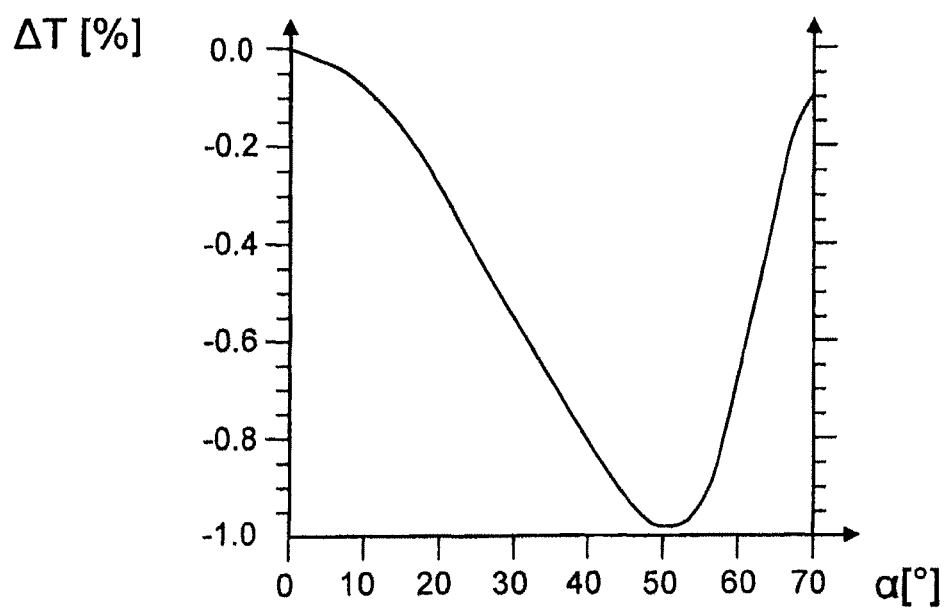
FIG. 4 shows a graph, in which the difference between the transmission coefficients for s- and p-polarized light is plotted as a function of the incidence angle for the exemplary embodiment shown in FIG. 2.
Figure 5:
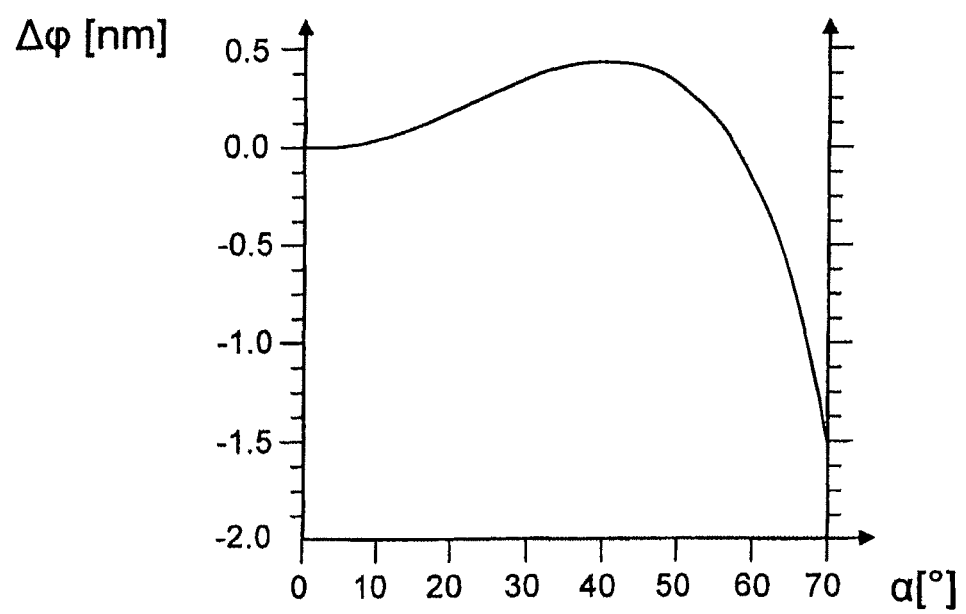
FIG. 5 shows a graph, in which the phase difference between s- and p-polarized light is plotted as a function of the incidence angle for the exemplary embodiment shown in FIG. 2.

FIGS. 3, 4 and 5 show graphs in which the average transmissivity $\langle T \rangle$, the difference $\Delta T$ between the transmission coefficients according to Eq. (2) and the phase difference according to Eq. (4) are respectively plotted as a function of the incidence angle $\alpha$ for the antireflection coating 32. It can be seen that $\Delta T < 1\%$ and $\Delta \phi < 0.1 \cdot \lambda$ apply over an angle range of 70°. The average transmissivity $\langle T \rangle$ is however not consistently higher than 98% over this incidence angle range, rather it falls off to values below 92% for large incidence angles. This may therefore lead to the aforementioned field- and/or angle-dependent intensity variations.

In order to avoid intensity variations in the image plane 28, grey filters may be used which are likewise to be positioned near the field. As an alternative to this, it is possible to position filter elements with angle-dependent transmissivities near the pupil. Such an angle-dependent grey filter is indicated by 50 in FIG. 1. Further designs of grey filters, which are suitable in this context, may be found in US 2005/0018312 A1.

In a scanning projection exposure apparatus 10, it is also feasible to use a field aperture, which includes a multiplicity of individually displaceable aperture elements, in the illumination system 12. Such field apertures which are known per se, as described for example in EP 0 952 491 A2, make it possible to vary the radiation dose in the image plane 28 as a function of the longitudinal position of the slit-shaped light field.

If the antireflection coating 32 lies in the vicinity of a pupil plane, however, then this will generate pupil apodisation. Such pupil apodisations may be corrected by suitably configured antireflection layers in the vicinity of a pupil plane. Tilting of the pupil apodisation, which can be described by the Zernike coefficients Z2/Z3, may be corrected by a mirror layer.

Stronger double reflections, which may occur owing to the average transmissivity $\langle T \rangle$ being lower at particular angles, may be absorbed by anti-scattering apertures.

Since the average phase $\langle \phi \rangle$ is likewise not given priority in the optimisation of the antireflection coating, phase errors due to the antireflection coating 32 may lead to imaging errors.

Such imaging errors may be corrected, at least within certain limits, by manipulators which are known per se. Particularly good correction is achieved when interfaces of optical elements, or plates separately provided here, are deformed locally and non-axisymmetrically. The deformations, which may be generated by adding or removing material, are in this case of the order of a few nanometers, such as less than 50 nanometers.

Instead of respectively optimising the individual antireflection coatings with a view to minimal polarization dependency, it is also possible to carry out an overall optimisation of a plurality or all of the antireflection coatings contained in the projection objective 20, and optionally throughout the projection exposure apparatus 10. The conditions mentioned above may then be described as $T_{total} < 10\%$,
(e.g., <3%, <1%) and
$\Delta\phi_{total} < \lambda/10$.

Naturally, the above considerations also apply for reflection coatings such as are used for curved imaging mirrors or plane deviating mirrors in the projection exposure apparatus 10.

Several exemplary embodiments of antireflection coatings will be described below, some of which likewise have a particularly small difference between the transmission coefficients for orthogonal polarization states. In other exemplary embodiments, although this difference is greater, particularly high average transmission coefficients and/or particularly small phase splittings are nevertheless achieved over a sizeable incidence angle range. It should furthermore be pointed out that the transmission performance will now be described no longer by specifying the transmission coefficients T, but by specifying the reflection coefficients R. If the coatings have a negligible absorption, then T=1−R applies. Small reflection coefficients therefore correspond to large transmission coefficients, and vice versa.

Exemplary Embodiment 2

Figure 6:
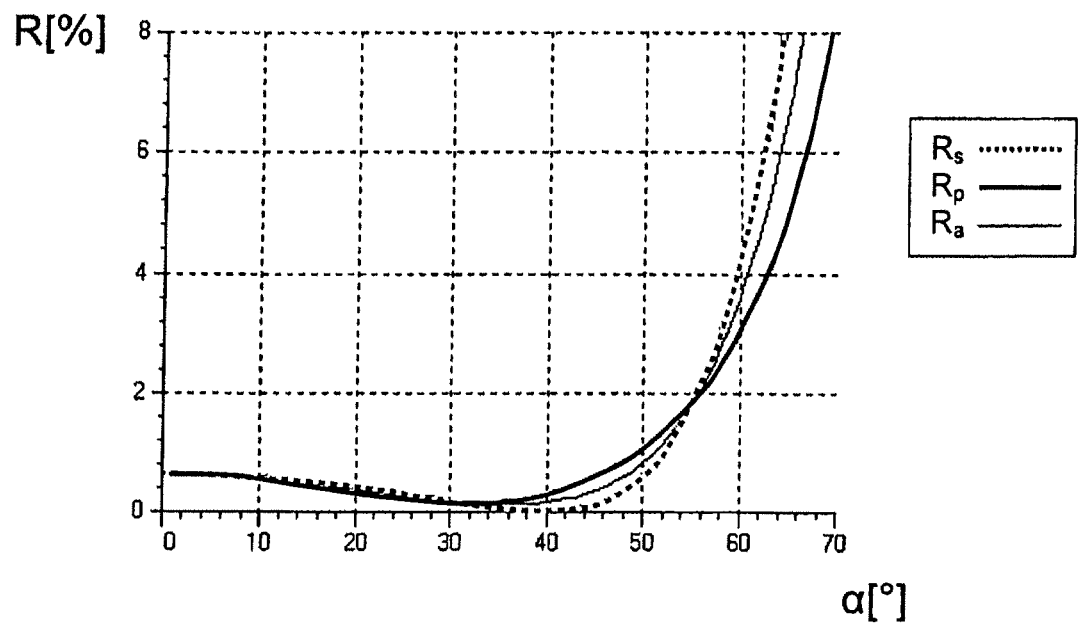
FIGS. 6 to 9 show graphs, in which the reflection coefficients for s-polarized, p-polarized and unpolarized light are respectively plotted as a function of the incidence angle for antireflection coatings according to further exemplary embodiments.

Table 2 gives the layer specification for an exemplary embodiment of an antireflection coating, which includes four layers in total. FIG. 6 shows a graph in which the reflection coefficients $R_s$, $R_p$ and $R_a$ for s-polarized, p-polarized and unpolarized light are respectively plotted as a function of the incidence angle for this antireflection coating.

TABLE 2

Layer Specification Exemplary Embodiment 2

| Layer | 1 | 2 | 3 | 4 |
|---|---|---|---|---|
| Material | $LaF_3$ | $MgF_2$ | $LaF_3$ | $MgF_2$ |
| QWOT | 2 | 1 | 1.25 | 1 |
| Range | 1.6–2.2 | 0.8–1.5 | 1.2–1.5 | 0.9–1.1 |

As in Exemplary Embodiment 1 described above, the layers are counted starting from the support material which, for example, may be a lens or a plane-parallel plate. $CaF_2$, which has a refractive index of about 1.56 at a wavelength of 193 nm, will be assumed as the material of the support (substrate) in this exemplary embodiment and the ones described below. It is however also possible to use other support materials, for example synthetic quartz glass ($SiO_2$) or barium fluoride ($BaF_2$); the optical properties of the antireflection coating will only be modified relatively slightly by this.

Lanthanum fluoride ($LaF_3$), which has a refractive index of about 1.69 at a wavelength of 193 nm has been assumed for the more highly refractive layers. Magnesium fluoride ($MgF_2$), which has a refractive index of about 1.43 at the same wavelength, has been assumed for the less refractive layers. The known production methods, for example PVD or CVD methods, may be employed in order to produce the layers.

Of course, the materials mentioned for the more highly refractive layers and the less refractive layers may also replaced by other materials respectively with similar refractive indices. Also suitable as more highly refractive materials, besides $LaF_3$, are in particular $NdF_3$, $Al_2O_3$ and $ErF_3$. Besides $MgF_2$ for the less refractive materials, $AlF_3$, chiolite or kryolite may for example also be envisaged. Since these materials have somewhat different refractive indices from the materials mentioned in Table 2, differences may arise for the optical thicknesses specified there in units of QWOT (quarter wave optical thickness). These are mentioned in the last row of Table 2 in the form of range specifications. Even when employing $LaF_3$ and $MgF_2$, it may be expedient to use optical thicknesses within the value ranges in the table, for example in order to carry out fine tuning.

A common feature of the more highly and less refractive materials is that refractive indices in the range of between about 1.60 and 1.92, or in the range of between about 1.37 and 1.44, can respectively be achieved by them without the packing density thereby decreasing below a value of 85%. These layers are therefore more durable and do not substantially change their optical properties even after prolonged operating times and under different environmental effects.

The graph shown in FIG. 6 reveals that with this antireflection coating, consisting of only four layers, the reflection coefficients $R_s$ and $R_p$ for s-polarized and p-polarized light differ only very slightly from one another over an incidence angle range of between 0° and 60°, specifically by no more than 1%. For an incidence angle range of between 0° and 50°, not only the difference but also the absolute value of the reflection coefficients $R_s$ and $R_p$ are less than 1%.

A particular feature of this antireflection coating is that the reflection coefficient $R_s$ for s-polarized light is less than the reflection coefficient $R_p$ for p-polarized light for incidence angles of between about 35° and 55°. Such behaviour, which was described for the first time—albeit for an incidence angle range above 55°—in JP 2004-302113 is unusual because p-polarized light is in principle transmitted better than s-polarized light according to the Fresnel equations.

This reversal of the reflection behaviour which is conventional per se, over a particular angle range, can advantageously be used to compensate for effects due to the conventional polarization-dependent reflection behaviour at other coatings. Even if the difference between the reflection coefficients for the s-polarized and p-polarized light can be kept very small, as shown by the first exemplary embodiment and also some of the subsequent exemplary embodiments, this nevertheless often involves more complex layer systems with six or more individual layers, the production of which is correspondingly elaborate. If however an antireflection coating having the properties shown in FIG. 6 is combined with another simply constructed antireflection coating, which has a higher reflectivity for s-polarized light than for p-polarized light over an incidence angle range, then polarization-neutral behaviour can be achieved overall.

To this end, it is not categorically necessary that the antireflection coatings, whose polarization dependencies are intended to compensate for one another, should exhibit the described behaviour in the same incidence angle range. Light rays which strike one optical surface at large incidence angles may strike another optical surface at small incidence angles, and vice versa. If two identically constructed antireflection coatings, which have ranges with $R_s > R_p$ and $R_s < R_p$, are applied onto optical surfaces selected in such a way, then there polarization dependencies can neutralise one another. In general, however, the situation is simplest when the compensating antireflection coatings are applied on the entry and exit surfaces of an optical element, for example a lens. This is because when optical systems are being configured, attempts are often made to make the incidence angles similar on the entry and exit surfaces of the optical lenses. If however there are many other optical elements between the antireflection coatings, then the incidence angle distribution may be modified in a relatively complicated way by the optical elements lying between them.

It is to be understood that the layer specification given in Table 2 need not be identical over the entire surface of the optical element. Since different regions on an optical element are often exposed to different distributions of incidence angles, it may be expedient for different antireflection coatings, which are optimally adapted to the angle spectrum respectively encountered, to be applied onto the different regions.

Exemplary Embodiment 3

Figure 7:
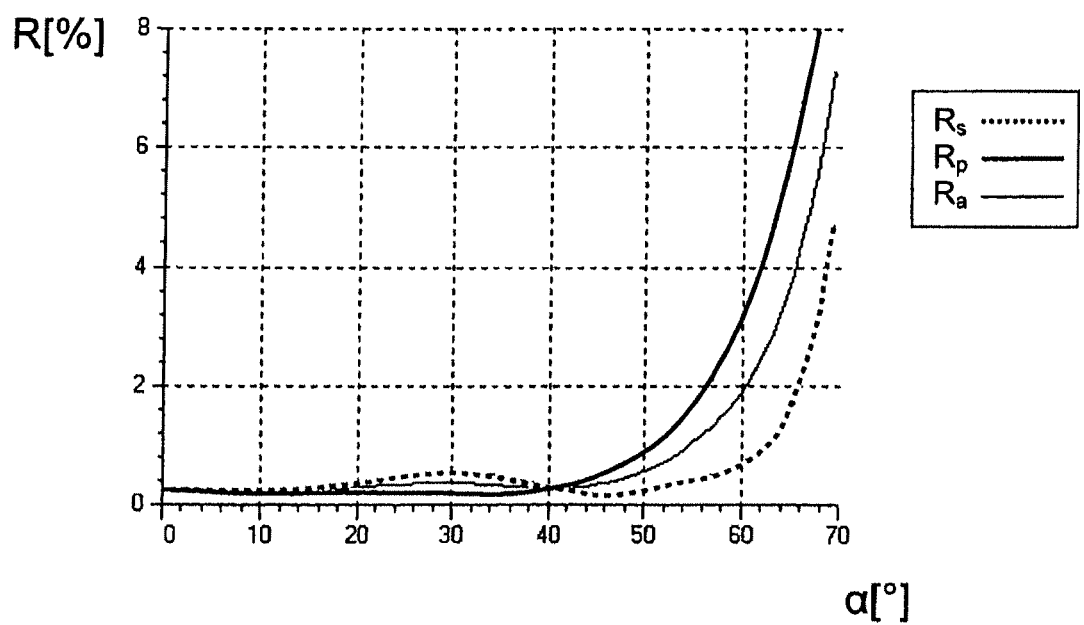

Table 3 gives the layer specification for an exemplary embodiment of an antireflection coating, which includes eight layers in total. FIG. 7 shows a graph in which the reflection coefficients $R_s$, $R_p$ and $R_a$ for s-polarized, p-polarized and unpolarized light are respectively plotted as a function of the incidence angle for this antireflection coating.

TABLE 3

Layer Specification Exemplary Embodiment 3

| Layer | 1 | 2 | 3 | 4 | 5 | 6 | 7 | 8 |
|---|---|---|---|---|---|---|---|---|
| Material | LaF$_3$ | MgF$_2$ | LaF$_3$ | MgF$_2$ | LaF$_3$ | MgF$_2$ | LaF$_3$ | MgF$_2$ |
| QWOT | 1.8 | 1.9 | 1.1 | 1.8 | 1.55 | 1 | 1.25 | 1 |
| Range | 1.5-2.4 | 1.7-2.1 | 0.8-1.5 | 1.6-2.1 | 1.3-1.8 | 0.8-1.5 | 1.2-1.5 | 0.9-1.1 |

It can be seen in the graph of FIG. 7 that the reflection behaviour differs from the per se conventional behaviour at incidence angles of more than about 40° here, because s-polarized light is reflected much less than p-polarized light there. The negative difference $\Delta R=R_s-R_p$ of the reflection coefficients $R_s$ and $R_p$ increases substantially more strongly at the incidence angles of about 50° than is the case with the antireflection coating shown with the aid of FIG. 12 of JP 2004-302113. The antireflection coating with the layer specification given in Table 3 can therefore be used even better to compensate for polarization dependencies of other layers, as was explained above in relation to Exemplary Embodiment 2.

A substantial advantage over the antireflection coating described in JP 2004-302113 is, above all, that only layers which have a packing density of more than 85% are used in the antireflection coating described here. In the exemplary embodiment described in JP 2004-302113, however, the packing density of the lowermost layer is merely 49% in order to be able to achieve the low refractive index of 1.21. A low packing density of this type is disadvantageous because such an incompact layer is susceptible to environmental effects and therefore modifies its optical properties relatively quickly as a function of time.

Exemplary Embodiment 4

Figure 8:
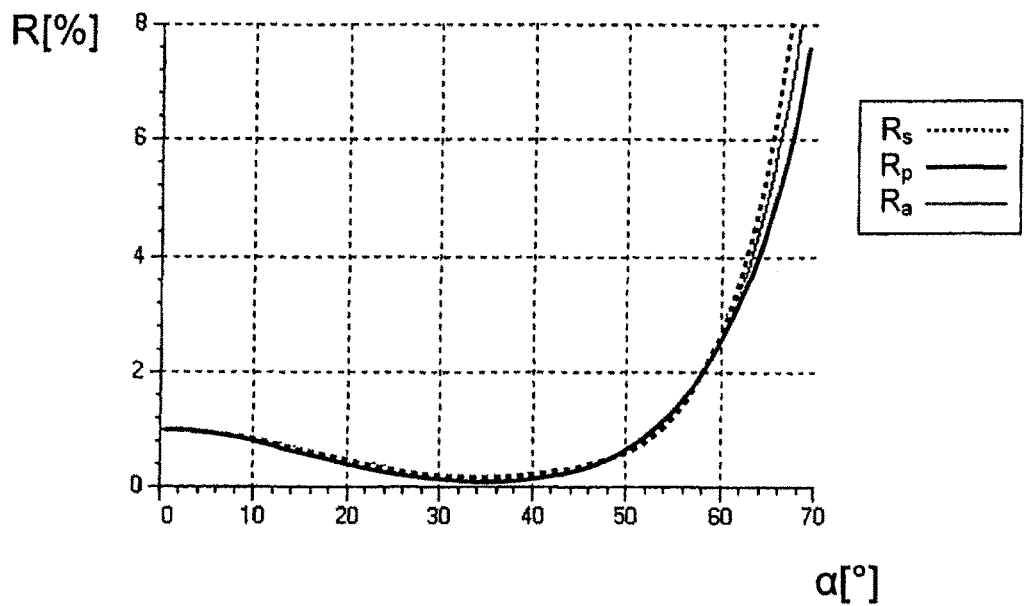

Table 4 gives the layer specification for another exemplary embodiment of an antireflection coating, which includes seven layers in total. FIG. 8 shows a graph in which the reflection coefficients for s-polarized, p-polarized and unpolarized light are respectively plotted as a function of the incidence angle for this antireflection coating.

TABLE 4

Layer Specification Exemplary Embodiment 4

| Layer | 1 | 2 | 3 | 4 | 5 | 6 | 7 |
|---|---|---|---|---|---|---|---|
| Material | MgF$_2$ | LaF$_3$ | MgF$_2$ | LaF$_3$ | MgF$_2$ | LaF$_3$ | MgF$_2$ |
| QWOT | 1.2 | 0.5 | 0.3 | 1.2 | 1.15 | 1.15 | 1.1 |
| Range | 0.96-1.44 | 0.4-0.91 | 0.2-0.4 | 0.59-1.1 | 1.06-1.24 | 1.06-1.2 | 1.0-1.2 |

The reflection coefficients for s-polarized and p-polarized light differ only very slightly between incidence angles of 0° and 60°, specifically by no more than 0.1%. At 4%, the absolute values $R_s$ and $R_p$ are likewise very similar in an angle range of between about 20° and 50°. This antireflection coating is therefore suitable in particular for such optical elements which light strikes only obliquely with incidence angles in the range, or at least predominantly obliquely.

The antireflection coating with the layer specification given in Table 4 has also been optimised with a view to achieving a minimal phase difference $\Delta\phi$ between s-polarized and p-polarized light after passing through the antireflection coating. In order to obtain a small phase difference $\Delta\phi$, it is favorable for the coating to consist of as few layers as possible, but at least for the thickness of the layers provided to be as small as possible. Comparison of the layer specification given in Table 4 with the layer specification given in Table 3, for Exemplary Embodiment 3, shows that this rule can be satisfied without thereby entailing intolerably large differences $\Delta R=R_s-R_p$. In Exemplary Embodiment 4, a phase difference is achieved which is less than 0.5° for incidence angles of between 0° and 50°, and which does not reach about 6° until an incidence angle of 70°.

Figure 9:
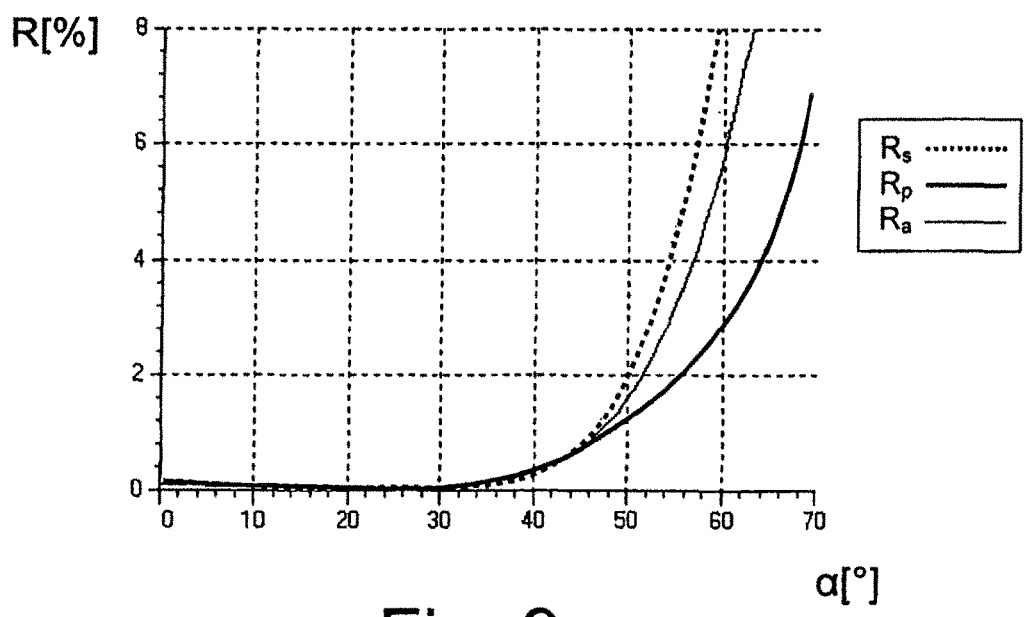

If all the layers are made about 7% thinner based on the layer specification given in Table 4, then the range with particularly small reflection coefficients will be shifted to smaller incidence angles as revealed by the graph of FIG. 9. This modification makes the antireflection coating particularly suitable for incidence angles of between 0° and about 40°. In this incidence angle range, the reflection coefficients $R_s$ and $R_p$ for s-polarized and p-polarized light are both below about 0.2%; the differences $\Delta R$ between the reflection coefficients are an order of magnitude less. The phase difference $\Delta\phi$ is likewise shifted to smaller incidence angles here. The phase difference $\Delta\phi$ at incidence angles of 70° is therefore somewhat higher, specifically 10°.

Exemplary Embodiment 5

In Exemplary Embodiments 2 and 3, the phase splitting may also be reduced if it is feasible for the thicker layers, in particular, to be made thinner.

Table 5 shows the layer specification for an antireflection coating which is based on the layer specification shown in Table 3 for Exemplary Embodiment 3. The thicker layers 2, 4 and 5 provided there are now much thinner.

TABLE 5

Layer Specification Exemplary Embodiment 5

| Layer | 1 | 2 | 3 | 4 | 5 | 6 | 7 | 8 |
|---|---|---|---|---|---|---|---|---|
| Material | LaF$_3$ | MgF$_2$ | LaF$_3$ | MgF$_2$ | LaF$_3$ | MgF$_2$ | LaF$_3$ | MgF$_2$ |
| QWOT | 2.4 | 0.2 | 1.1 | 0.4 | 0.3 | 1 | 1.25 | 1 |
| Range | 1.8-2.6 | 0.05-0.4 | 0.3-1.4 | 0.05-0.4 | 0.05-0.4 | 0.8-1.5 | 1.2-1.5 | 0.9-1.1 |

Figure 10:
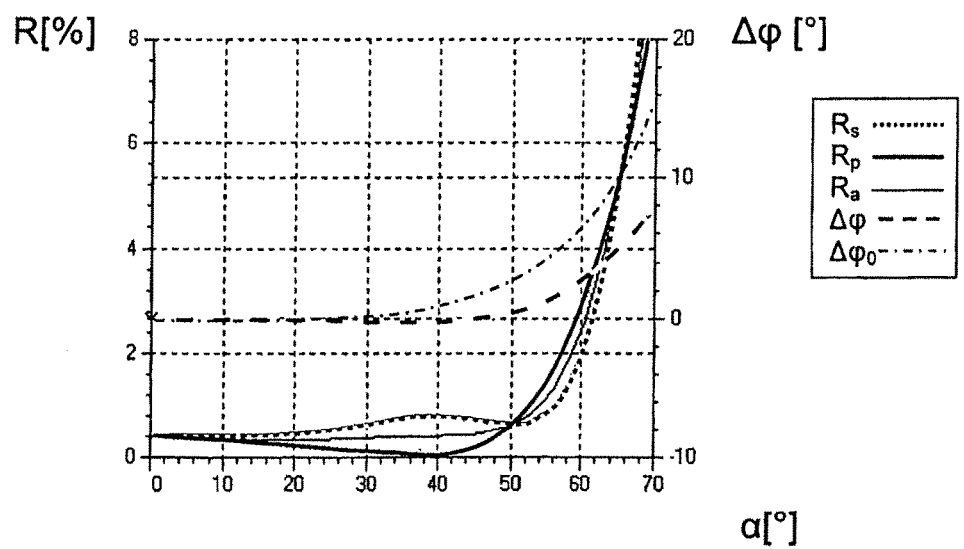
FIGS. 10 and 11 show graphs, in which the reflection coefficients for s-polarized, p-polarized and unpolarized light, as well as the phase difference, are respectively plotted as a function of the incidence angle for antireflection coatings according to two other exemplary embodiments.

FIG. 10 shows a graph in which the reflection coefficients for s-polarized, p-polarized and unpolarized light are respectively plotted as a function of the incidence angle for this antireflection coating. The phase difference Δφ or Exemplary Embodiment 5 is plotted with a line of dashes, and for Exemplary Embodiment 3 with thin dots and dashes for comparison. It may be seen clearly that much smaller phase differences Δφ are entailed for incidence angles of more than about 30° owing to the reduction of the layer thicknesses. On the other hand, the reflection behaviour has not been compromised significantly by the modification carried out, as shown by a comparison of FIGS. 10 and 7.

Exemplary Embodiment 6

Figure 11:
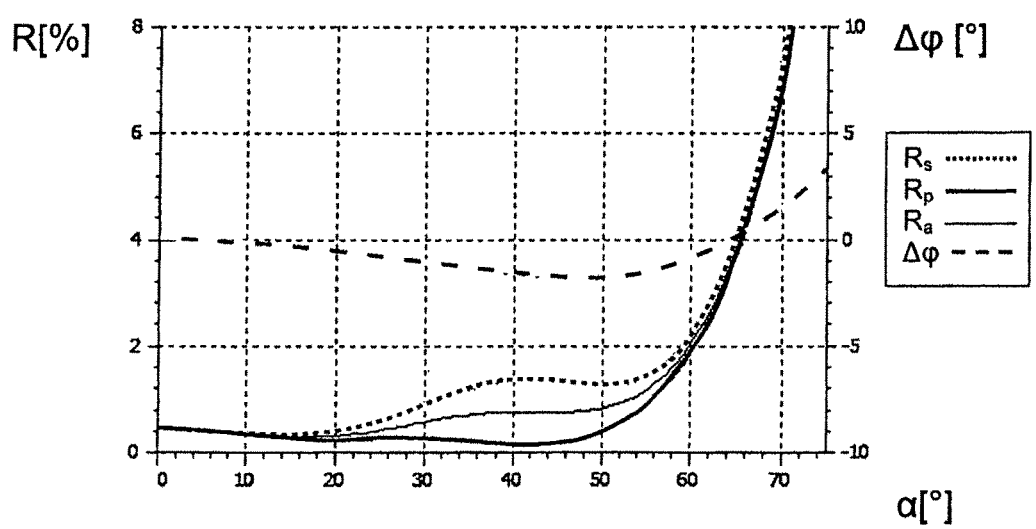

Table 6 gives the layer specification for another exemplary embodiment of an antireflection coating, which includes eight layers in total. FIG. 11 shows a graph corresponding to FIG. 10, in which the reflection coefficients for p-polarized, s-polarized and unpolarized light as well as the phase difference Δφ are plotted as a function of the incidence angle.

TABLE 6

Layer Specification Exemplary Embodiment 6

| Layer | 1 | 2 | 3 | 4 | 5 | 6 | 7 | 8 |
|---|---|---|---|---|---|---|---|---|
| Material | LaF$_3$ | chiolite | LaF$_3$ | chiolite | LaF$_3$ | chiolite | LaF$_3$ | chiolite |
| QWOT | 0.82 | 0.49 | 0.15 | 1.19 | 2.15 | 1.77 | 0.64 | 1.410 |
| Range | 0.4–0.85 | 0.3–0.55 | 0.3–0.55 | 1.15–1.7 | 1.9–2.15 | 1.7–1.8 | 0.5–0.95 | 1.15–1.4 |

The antireflection coating according to this exemplary embodiment is distinguished by a particularly small phase difference, the absolute value of which does not exceed 5° throughout the incidence angle range of between 0° and 70°. With this antireflection, it is furthermore noteworthy coating that the phase difference Δφ is negative in an angle range of between 0° and about 65°. This means that p-polarized light passes through the antireflection coating with a retardation relative to the s-polarized light within this incidence angle range. This unusual behaviour may be used to compensate for a positive phase difference, in a similar way as was explained above in connection with Exemplary Embodiment 2 for the reflection coefficients $R_s$, $R_p$. Here again, it is true that the combination of at least one antireflection coating having a positive phase difference with another antireflection coating having negative phase splitting can achieve the effect that s-polarized and p-polarized light no longer have a significant phase difference after passing through the two antireflection coatings.

In this case, for example, it is also possible that the contributions of a multiplicity of antireflection coatings to a sizeable positive phase difference may be compensated for by a single antireflection coating or a few antireflection coatings with a negative phase difference. Here again, the angle ranges of the antireflection coatings with a positive phase difference and those with a negative phase difference need not necessarily coincide.

Methods of computer-assisted optimisation, for example the variation method, may be employed in order to achieve substantially polarization-neutral behaviour in respect of reflectivity and phase by combining different antireflection coatings.

In general, it will be simplest to optimise the antireflection coatings in a first step such that a minimal difference in the reflectivity for orthogonal polarization states is obtained overall. In a second step, phase differences still existing on one or a few, for example 4, antireflection coatings may then be reduced. The reverse procedure may of course also be adopted, by starting with reduction of the phase differences and subsequently optimising the reflectivity. Simultaneous optimisation in respect of both the reflectivity and the phase difference is also possible in principle.

What is claimed is:

1. An optical system, comprising:
   a plurality of optical elements; and
   a plurality of antireflection coatings including a first antireflection coating and a second antireflection coating,
   wherein:
      each of the plurality of optical elements supports at least one of the plurality of antireflection coatings;
      within a first incidence angle range, the first antireflection coating has a polarisation-dependent reflectivity which is greater for s-polarised light than for p-polarised light;
      within a second incidence angle range, the second antireflection coating has a polarisation-dependent reflectivity which is less for s-polarised light than for p-polarised light;
      the first and second antireflection coatings are arranged in a beam path of projection light so that their polarisation-dependent differences in reflectivity at least partially compensate each other;
      the first antireflection coating is different from the second antireflection coating; and
      the optical system is a microlithographic optical system.

2. The optical system of claim 1, wherein the first and second antireflection coatings are arranged in the beam path of the projection light so that at least some light rays impinge on the first antireflection coating with incidence angles lying within the first incidence angle range, and also impinge on the second antireflection coating with incidence angles lying within the second incidence angle range.

3. The optical system of claim 1, wherein the first incidence angle range is at least substantially identical to the second incidence angle range.

4. The optical system of claim 3, wherein the first and second antireflection coatings are supported by the same optical element.

5. The optical system of claim 1, wherein the first incidence angle range is different from the second incidence angle range.

6. The optical system of claim 5, wherein the first antireflection coating is supported by a first optical element, and the second antireflection coating is supported by a second optical element.

7. The optical system of claim 1, wherein the polarisation-dependent differences in reflectivity for the first and second antireflective coatings compensate each other so that a total transmission of the optical system does not depend on a state of polarisation of the projection light.

8. The optical system of claim 1, further comprising:
   a third antireflection coating configured so that, within a third incidence angle range, p-polarised light passes through the third antireflection coating with a retardation relative to s-polarised light; and
   a fourth antireflection coating configured so that, within a fourth incidence angle range, s-polarised light passes through the fourth antireflection coating with a retardation relative to p-polarised light, wherein the third and fourth antireflection coatings are arranged in the beam path of the projection light so that their polarisation-dependent phase differences at least partially compensate each other.

9. An apparatus, comprising:
the optical system of claim 1,
wherein the apparatus is a microlithographic projection exposure apparatus.

10. The optical system of claim 1, wherein a portion of the first incidence angle range overlaps with a portion of the second incidence angle range.

11. An optical system, comprising:
a plurality of optical elements; and
a plurality of antireflection coatings including a first antireflection coating and a second antireflection coating,
wherein:
    each optical element supports at least one of the plurality of antireflection coatings;
    the first antireflection coating is configured so that, within a first incidence angle range, p-polarised light passes through the first antireflection coating with a retardation relative to s-polarised light;
    the second antireflection coating is configured so that, within a second incidence angle range, s-polarised light passes through the second antireflection coating with a retardation relative to p-polarised light;
    the first and second antireflection coatings are arranged in a beam path of projection light so that their polarisation-dependent retardation differences at least partially compensate each other; and
    the optical system is a microlithographic optical system.

12. The optical system of claim 11, wherein the first and second antireflection coatings are arranged in the beam path of the projection light so that at least some light rays impinge on the first antireflection coating with incidence angles lying within the first incidence angle range, and also impinge on the second antireflection coating with incidence angles lying within the second incidence angle range.

13. The optical system of claim 11, wherein the first incidence angle range is at least substantially identical to the second incidence angle range.

14. The optical system of claim 13, wherein the first and second antireflection coatings are supported by the same optical element.

15. The optical system of claim 11, wherein the first incidence angle range is different from the second incidence angle range.

16. The optical system of claim 15, wherein the first antireflection coating is supported by a first optical element, and the second antireflection coating is supported by a second optical element.

17. The optical system of claim 11, wherein the polarisation-dependent differences in reflectivity for the first and second antireflective coatings compensate each other so that a total transmission of the optical system does not depend on a state of polarisation of the projection light.

18. An apparatus, comprising:
the optical system of claim 11,
wherein the apparatus is a microlithographic projection exposure apparatus.

19. The optical system of claim 11, wherein a portion of the first incidence angle range overlaps with a portion of the second incidence angle range.

20. An optical system, comprising:
a plurality of optical elements; and
a plurality of antireflection coatings,
wherein:
    each of the plurality of optical elements supports at least one of the plurality of antireflection coatings;
    each antireflection coating has a polarisation-dependent reflectivity;
    a combination of each of the plurality of antireflection coatings has a substantially polarisation-neutral reflectivity;
    at least one of the plurality of antireflection coatings is different from another of the plurality of antireflection coatings; and
    the optical system is a microlithographic optical system.

21. The optical system of claim 20, wherein:
the plurality of antireflection coatings include first and second antireflection coatings;
within a first incidence angle range, the first antireflection coating has a polarisation-dependent reflectivity which is greater for s-polarised light than for p-polarised light;
within a second incidence angle range, the second antireflection coating has a reflectivity which is less for s-polarised light than for p-polarised light; and
the first and second antireflection coatings are arranged in a beam path of projection light so that their polarisation-dependent differences in reflectivity at least partially compensate each other.

22. The optical system of claim 21, wherein a portion of the first incidence angle range overlaps with a portion of the second incidence angle range.

23. The optical system of claim 21, wherein each antireflection coating has polarisation-dependent behaviour with respect to phase, and wherein the combination of all antireflection coatings has a substantially polarisation-neutral behaviour with respect to phase.

24. The optical system of claim 23, further comprising:
a third antireflection coating configured so that, within a third incidence angle range, p-polarised light passes through the third antireflection coating with a retardation relative to s-polarised light; and
a fourth antireflection coating configured so that, within a fourth incidence angle range, s-polarised light passes through the fourth antireflection coating with a retardation relative to p-polarised light,
    wherein the third and fourth antireflection coatings are arranged in the beam path of the projection light so that their polarisation-dependent phase differences at least partially compensate each other.

25. An apparatus, comprising:
the optical system of claim 20,
wherein the apparatus is a microlithographic projection exposure apparatus.

26. An optical system, comprising:
a plurality of optical elements; and
a plurality of antireflection coatings,
wherein:
    each of the plurality of optical elements supports at least one of the antireflection coatings;
    each antireflection coating has polarisation-dependent behaviour with respect to phase;
    a combination of each of the plurality of antireflection coatings has a substantially polarisation-neutral behaviour with respect to phase; and
    the optical system is a microlithographic optical system.

27. The optical system of claim 26, wherein:
the first antireflection coating is configured so that, within a first incidence angle range, p-polarised light passes through the first antireflection coating with a retardation relative to s-polarised light; and
the second antireflection coating is configured so that, within a second incidence angle range, s-polarised light passes through the second antireflection coating with a retardation relative to p-polarised light.

28. The optical system of claim 27, wherein a portion of the first incidence angle range overlaps with a portion of the second incidence angle range.

29. An apparatus, comprising:
the optical system of claim 26,
wherein the apparatus is a microlithographic projection exposure apparatus.

* * * * *

UNITED STATES PATENT AND TRADEMARK OFFICE
CERTIFICATE OF CORRECTION

| | |
|---|---|
| PATENT NO. | : 9,733,395 B2 |
| APPLICATION NO. | : 13/112357 |
| DATED | : August 15, 2017 |
| INVENTOR(S) | : Vladimir Kamenov et al. |

It is certified that error appears in the above-identified patent and that said Letters Patent is hereby corrected as shown below:

In the Specification

<u>Column 8</u>
Line 10, delete "kryolite" and insert -- cryolite --

<u>Column 11</u>
Line 4, delete "or" and insert -- for --

Signed and Sealed this
Fifteenth Day of May, 2018

Andrei Iancu
*Director of the United States Patent and Trademark Office*